(12) United States Patent
Arai

(10) Patent No.: US 7,064,417 B2
(45) Date of Patent: Jun. 20, 2006

(54) SEMICONDUCTOR DEVICE INCLUDING A BIPOLAR TRANSISTOR

(75) Inventor: Chihiro Arai, Kanagawa (JP)

(73) Assignee: Sony Corporation, Tokyo (JP)

( * ) Notice: Subject to any disclaimer, the term of this patent is extended or adjusted under 35 U.S.C. 154(b) by 32 days.

(21) Appl. No.: 10/487,622

(22) PCT Filed: May 15, 2002

(86) PCT No.: PCT/JP02/08304

§ 371 (c)(1),
(2), (4) Date: Feb. 24, 2004

(87) PCT Pub. No.: WO03/021683

PCT Pub. Date: Mar. 13, 2003

(65) Prior Publication Data

US 2004/0235256 A1  Nov. 25, 2004

(51) Int. Cl.
*H01L 29/70* (2006.01)
(52) U.S. Cl. ............... 257/576; 257/587; 257/584; 257/571
(58) Field of Classification Search ............. 257/265, 257/571, 584, 587, 576, 273, 362, 47; 438/348
See application file for complete search history.

(56) References Cited

U.S. PATENT DOCUMENTS

| 5,198,689 | A | 3/1993 | Fujioka | |
|---|---|---|---|---|
| 5,346,840 | A | 9/1994 | Fujioka | |
| 5,751,053 | A | 5/1998 | Honda | |
| 6,004,878 | A | 12/1999 | Thomas | |
| 6,208,012 | B1 * | 3/2001 | Oishi | 257/565 |
| 6,274,921 | B1 * | 8/2001 | Hasegawa | 257/577 |
| 6,462,397 | B1 * | 10/2002 | Ryum et al. | 257/565 |
| 6,888,221 | B1 * | 5/2005 | Joseph et al. | 257/565 |
| 2002/0060353 | A1 * | 5/2002 | Matsuoka | 257/592 |
| 2002/0130370 | A1 | 9/2002 | Suzuki | |
| 2003/0178700 | A1 * | 9/2003 | Franosch et al. | 257/565 |

FOREIGN PATENT DOCUMENTS

EP   0375965   7/1990

(Continued)

*Primary Examiner*—Eugene Lee
(74) *Attorney, Agent, or Firm*—Sonnenschein, Nath & Rosenthal LLP

(57) ABSTRACT

A semiconductor device includes a bipolar transistor formed on a semiconductor substrate 1, in which a collector region 13 is formed on the semiconductor substrate 1; a first insulating layer 31 having a first opening 51 formed in a collector region 13 is formed on the surface of the semiconductor substrate 1; and a base semiconductor layer 14B is formed in contact with the collector region through the first opening 51. The base semiconductor layer 14B is formed such that the edge thereof extends onto the first insulating layer 31. An emitter semiconductor layer 14E is formed in a predetermined region on the base semiconductor layer; a second insulating layer 32 is formed on the first insulating layer 31 covering the edge of the base semiconductor layer 14E; a second opening 52 which opens the contact portion between the emitter semiconductor layer 14E and the base semiconductor layer 14B and a third opening 53 which opens a base electrode take-out portion of the base semiconductor layer 14B are formed; and a metal silicide layer 15 is formed on the surface of the aforementioned base semiconductor layer inside the third opening 53. A metal silicide layer can be formed in a self-aligned manner in a semiconductor device including a bipolar transistor, and silicide in other semiconductor elements can also be formed being self-aligned.

6 Claims, 16 Drawing Sheets

FOREIGN PATENT DOCUMENTS

| | | |
|---|---|---|
| EP | 1033758 | 9/2000 |
| JP | 57-176762 | 10/1982 |
| JP | 63-211755 | 9/1988 |
| JP | 02-150033 | 6/1990 |
| JP | 04-312926 | 11/1992 |
| JP | 05-29335 | 2/1993 |
| JP | 8-8268 | 1/1996 |
| JP | 2000-252294 | 9/2000 |
| JP | 2000-269422 | 9/2000 |
| KR | 1993-0004721 | 6/1993 |
| KR | 2000-0062664 | 10/2000 |

* cited by examiner

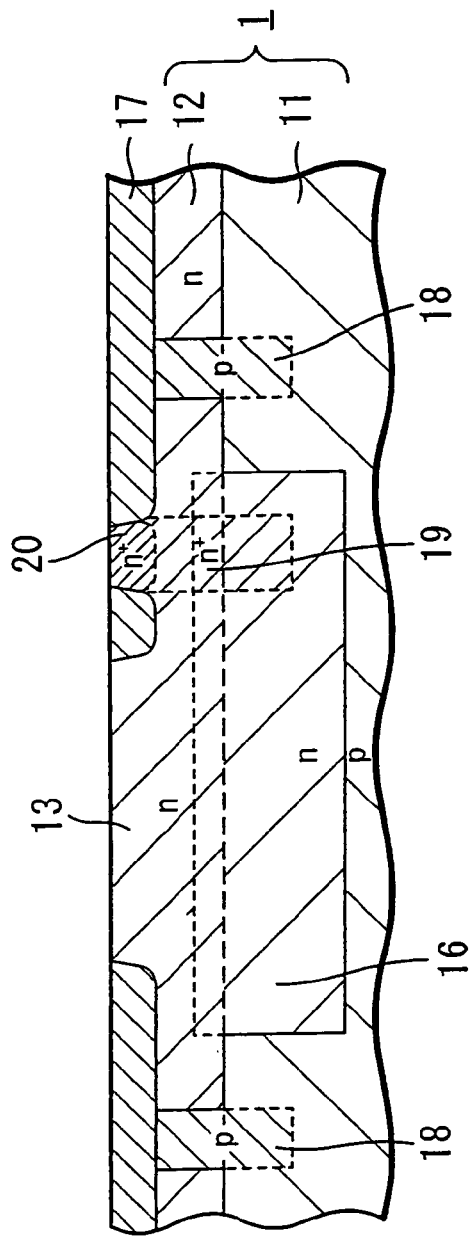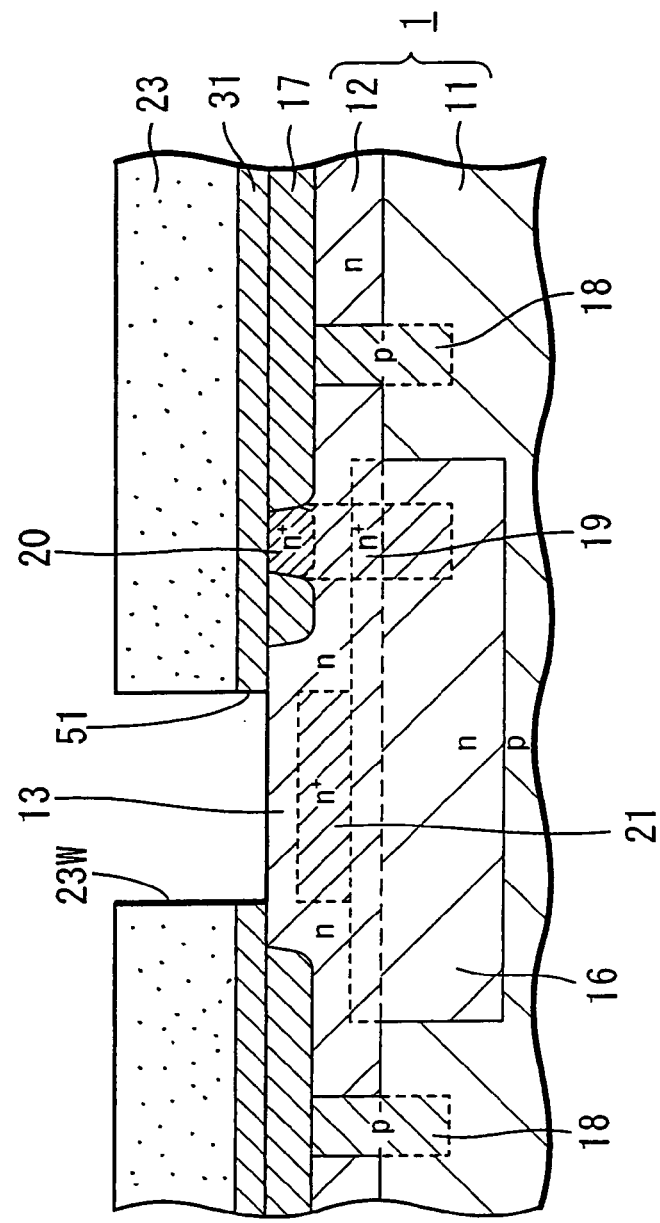
FIG. 2A
FIG. 2B

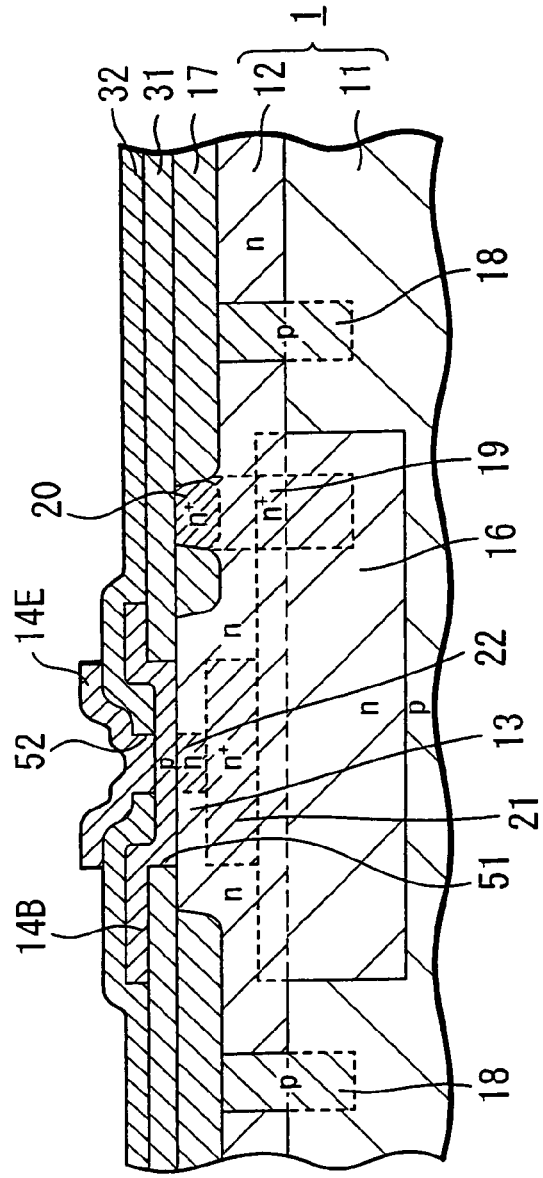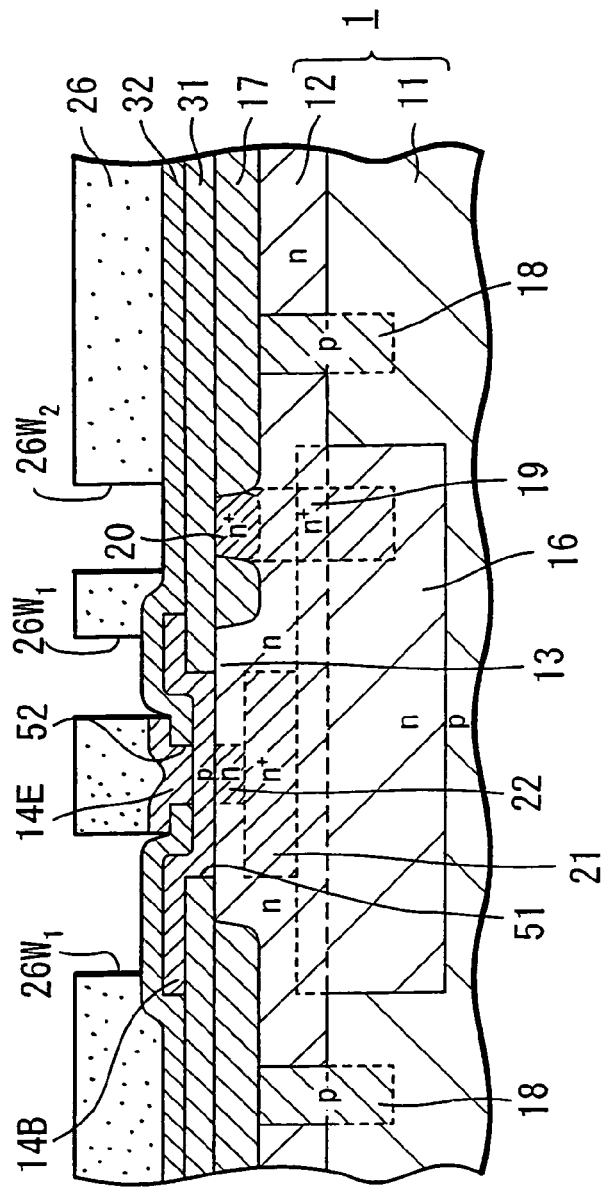
FIG. 4A
FIG. 4B

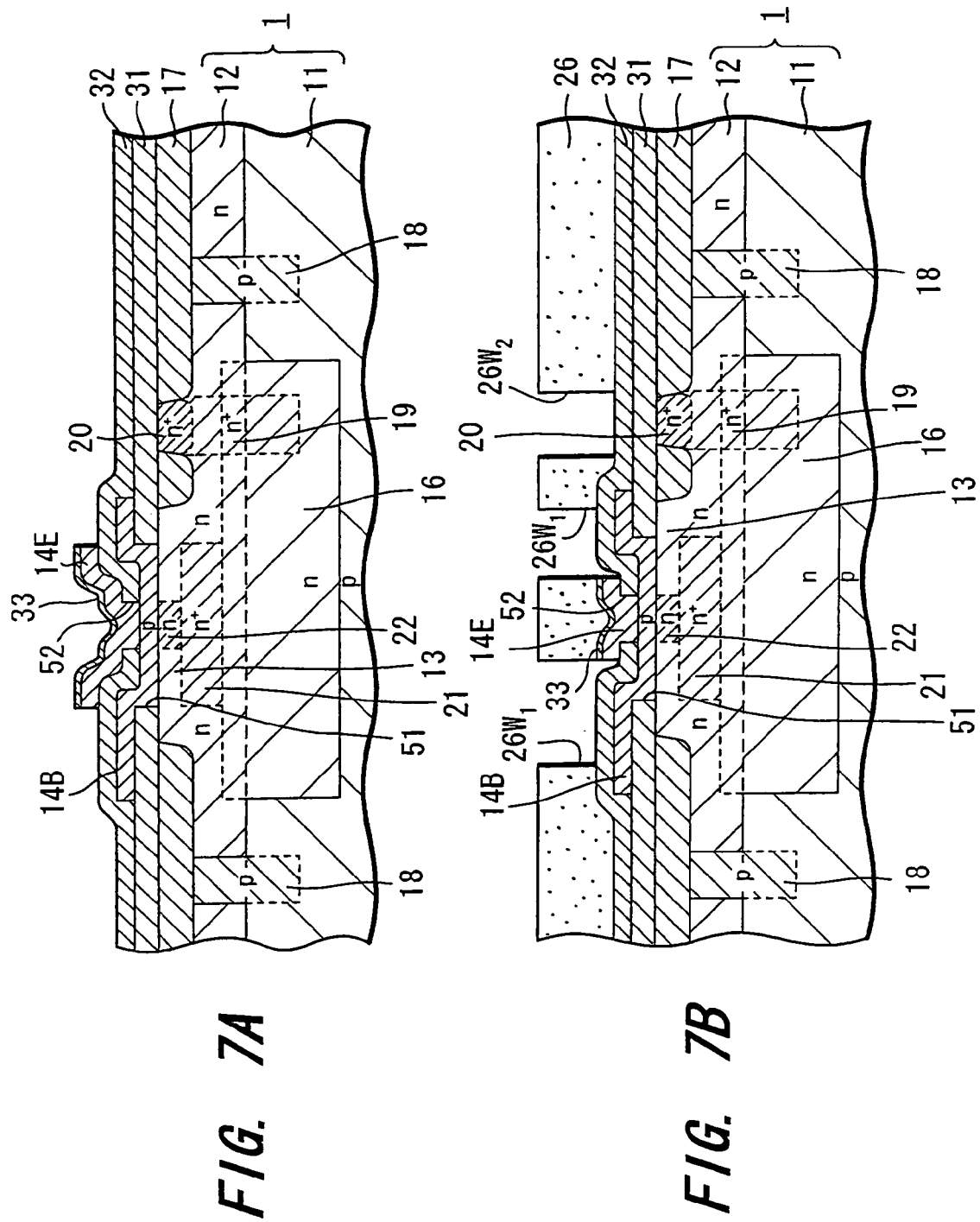

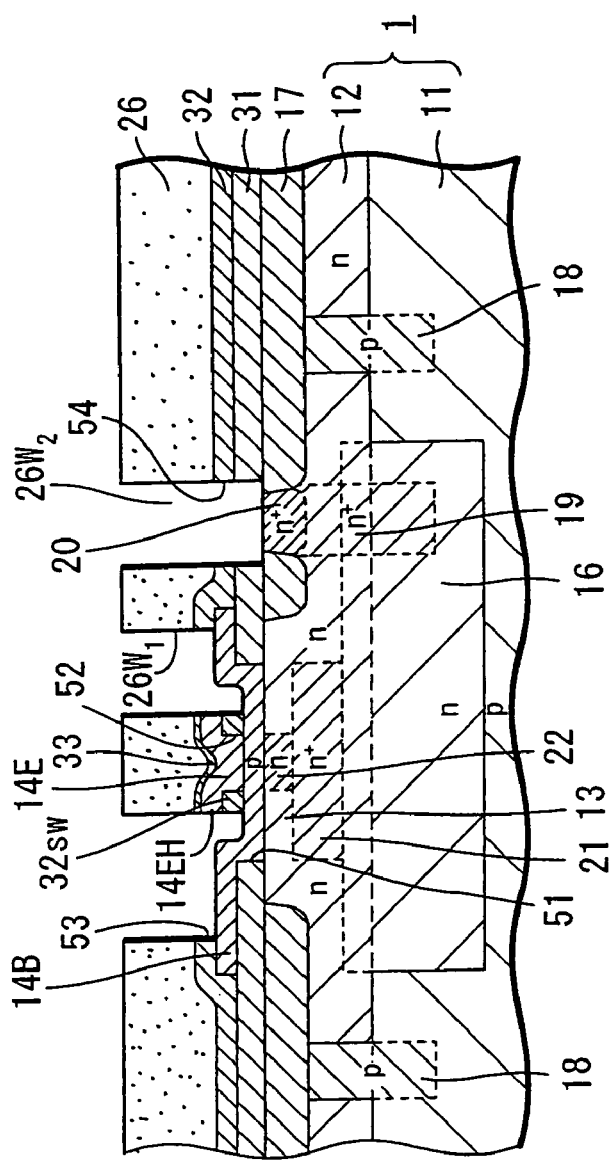
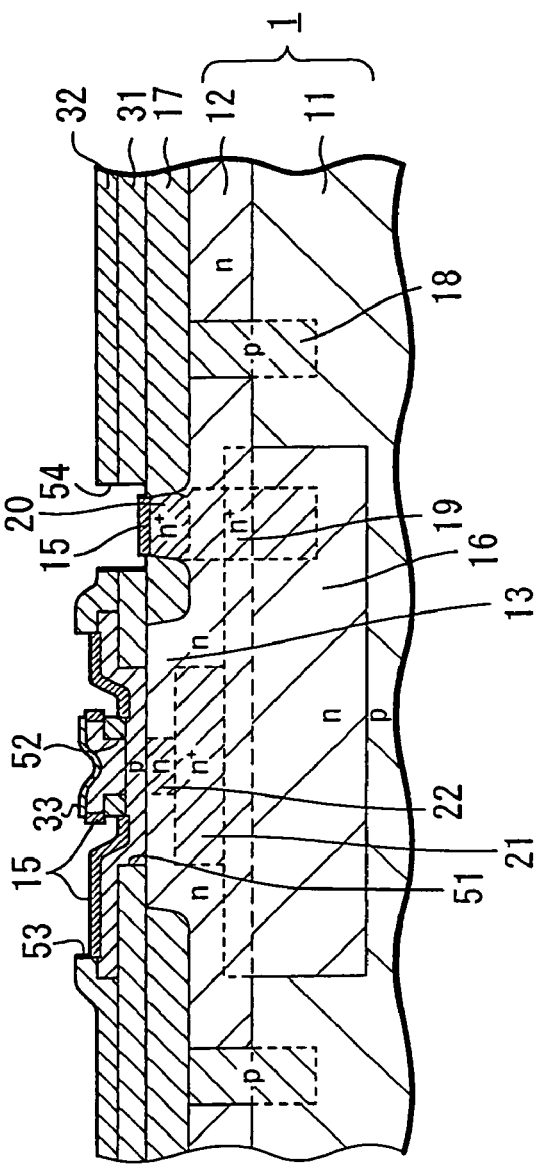
FIG. 8A
FIG. 8B

SEMICONDUCTOR DEVICE INCLUDING A BIPOLAR TRANSISTOR

BACKGROUND OF THE INVENTION

The present invention relates to a semiconductor device and a method for manufacturing thereof, particularly to a semiconductor device including a bipolar transistor and a method for manufacturing thereof.

A semiconductor device, particularly a semiconductor device including a bipolar transistor, is suitable to design an analog circuit due to characteristics of a bipolar transistor, such as high load driving force, high speed, low noise and the like.

FIG. 14 is a schematic cross-sectional view of a semiconductor device including a conventional bipolar transistor, and in this example a vertical npn bipolar transistor is formed on a silicon semiconductor substrate 100.

This semiconductor substrate 100 has on a p-type silicon substrate 101 a structure in which an n-type silicon semiconductor layer 102 has been grown epitaxially.

An n-type collector buried region 103 is formed in the substrate 101.

A separating and insulating layer 104 which separates a portion where the bipolar transistor is formed from the other portion is formed on the surface of the semiconductor layer 102 by means of LOCOS (Local Oxidation of Silicon).

Also, under the separating and insulating layer 104 element separating regions 105 which execute element separation by p-n junction are formed by ion implantation surrounding the portion where the bipolar transistor is formed.

Further, a window portion where the separating and insulating layer 104 is not formed is provided on the collector buried region 103, and an n-type plug-in region 106 having the depth that reaches the collector buried region 103, into which highly concentrated n-type impurities are ion-implanted, is formed under the window portion. Also, a highly concentrated collector electrode take-out region 107 is formed on the surface of this plug-in region 106.

A collector region 108 composed of a part of the n-type semiconductor layer 102 is formed on the collector buried region 103.

Also, a first insulating layer 111 made of $SiO_2$ is formed on the entire surface of the substrate 100 at first; and then an opening 111W is provided in this insulating layer 111, through which impurities are doped to form a collector highly concentrated region 109.

Across the inside of this opening 111W and on the first insulating layer 111, a base semiconductor layer 112 composed of a silicon semiconductor layer constituting an intrinsic base region and a base electrode take-out region is deposited.

This base semiconductor layer 112 is entirely deposited at first and then a requiring pattern is formed by pattern etching of means of photolithography.

Additionally, regarding this base semiconductor layer 112, the part deposited on the surface of the semiconductor substrate 100, namely, the part deposited directly on the semiconductor layer 102 is deposited as a epitaxially grown single-crystal layer, and the part formed on the first insulating layer 111 is deposited as a polycrystalline layer.

Further, a second insulating layer 113 made of $SiO_2$ is entirely formed covering the base semiconductor layer 112 at first; and then an opening 113W is provided in the base semiconductor layer 112, through which impurities are doped to form a collector portion 110.

Then, an emitter semiconductor layer 114 made of an n-type silicon semiconductor layer is deposited including the inside of the opening 113W.

This emitter semiconductor layer 114 is also entirely deposited at first and then patterned accordingly by pattern etching by means of photolithography. Specifically, as shown in FIG. 14, a photoresist layer 115 is patterned on the portion where the emitter semiconductor layer 114 is formed by coating a photoresist layer, pattern exposure, and development, as intended. With this photoresist layer 115 serving as an etching mask, the emitter semiconductor layer 114 is etched so as to be patterned accordingly, namely patterned to have a portion that is in connect with the base semiconductor layer 112 through the opening 113W and an extending portion 114H of an requiring width on the peripheral part of the opening 113W.

After that, as shown in FIG. 15, with the photoresist layer 115 serving as an etching mask, the second insulating layer 113 in FIG. 14 is etched by anisotropic etching, and the base take-out region of the base semiconductor layer 112 other than the portion in contact with the emitter semiconductor layer 114 is exposed to the outside.

On this occasion, intercalated insulating layers $113_{S1}$ and sidewalls $113_{S2}$ where the second insulating layer 113 remains are formed under the extending portion 114H of the emitter semiconductor layer 114 and on the outer end surface of the base semiconductor layer 112, respectively; as regards the etching performed on the insulating layer 113, overetching is executed in order for the surface of the base semiconductor layer 112 to be exposed without fail, so that later-mentioned metal salicide can be formed.

Subsequently, the photoresist 115 is removed, and a metal layer such as Ti or Co is, for example, sputtered on the entire surfaces of the base semiconductor layer 112 and the emitter semiconductor layer 114 exposed to the outside and heat treatment is performed, whereby only at the parts where this metal layer is directly deposited on the semiconductor layers 112 and 114 a low-resistance metal silicide layer 116 is formed by reaction of the metal and Si, as shown in FIG. 16.

After that, a planarizing and insulating layer 117 made of BPSG (Boron Phosphorus Silicate Glass) or the like is entirely formed.

A Contact through-hole 118 is provided in each of: the planarizing and insulating layer 117 on the metal silicide layer 116, one portion of which is on the base take-out region portion of the base semiconductor layer 112 and the other portion of which is on the emitter semiconductor layer 114, and also the planarizing and insulating layer 117 and the insulating layer 111 on the collector take-out region 107; and these contact through-holes 118 are each filled with electrodes made by filling conductive plugs with tungsten (W) or the like, that is to say, a base electrode 119B, an emitter electrode 119E, and a collector electrode 119C. In such manner, each of the electrodes 119B, 119E, and 119C has ohmic contact to the base take-out region portion of the base semiconductor layer 112 and the emitter semiconductor layer 114. On the other hand, a conductive layer 120 constituting wiring or electrodes formed on the planarizing and insulating layer 117 is contacted to each of those electrodes 119B, 119E and 119C.

As described above, a semiconductor integrated circuit device, in which as a circuit element a vertical bipolar transistor consisting of the collector portion 110 and the base and emitter regions made of the base semiconductor layer 112 and the emitter semiconductor layer 114 is formed, is constructed.

The aforementioned semiconductor device including a conventional bipolar transistor and the method for manufacturing thereof include the formation of a metal silicide layer; however, in this case, there are problems in forming a metal silicide layer at the target positions accurately and appropriately so that a reliable semiconductor device is obtained.

First of all, regarding the aforementioned conventional manufacturing method, the insulating layer 113 on the base semiconductor layer 112 shown in FIG. 14 is removed, and in the operation in which the base semiconductor layer 112 is exposed to the outside as shown in FIG. 15, etching onto the insulating layer 111 needs to be overetching in order for the base semiconductor layer 112 to be exposed without fail to the outside as mentioned above.

The amount of such overetching is generally required to be the amount corresponding to, for example, approximately 50% of the thickness of the second insulating layer 113.

Such overetching unavoidably gives restrictions when each of the film thicknesses of the first and second insulating layers 111 and 113 is selected.

Specifically, it is necessary to make the aforementioned first insulating layer 111 thicker or to make the second insulating layer 113 thinner.

However, increase in the film thickness of the first insulating layer 111 makes the unevenness at the peripheral part of the opening 111W of the base semiconductor layer 112 greater, so that inconvenience arises in which stress is greatly concentrated at that part.

Also, contrary to this, decrease in the film thickness of the second insulating layer 113 makes the height of the intercalated insulating layer $113_{S1}$ of the emitter semiconductor layer 114 diminished, so that parasitic capacitance between the extending portion 114H of the emitter layer 114 and the base semiconductor layer 112 which oppose each other with this intercalated insulating layer $113_{S1}$ in between increases, thereby hindering high-speed operation.

Additionally, regarding the construction in FIG. 16, since the metal silicide layer 116 is formed on the base and emitter semiconductor layers 112 and 114, electrode contact resistance thereto can be reduced. However, when taking out an electrode from the collector, since the collector take-out region 107 is provided without forming a metal silicide layer, contact resistance to the collector can not be reduced sufficiently.

Since this contact resistance to the collector is a factor which decides the saturation voltage $V_{CE(sat)}$ between a collector and an emitter of the bipolar transistor and the current gain, that is, the current capacity, with which the gain $h_{FE}$ of the transistor begins to decrease and with which the cutoff frequency $f_{Tmax}$ and the maximum vibration frequency $f_{max}$ begin to decrease, it is desirable that the contact resistance to the collector be reduced as much as possible in terms of low-voltage operation and high driving capability.

As mentioned above, in order to reduce the contact resistance to the collector, the cross-sectional area of the collector electrode 119C can be made large; in this case, however, the area for the collector electrode becomes large, so that a number of inconveniences such as decrease in the degree of integration, cost rise, and deterioration in the high-frequency characteristics due to the increase in the parasitic capacitance of the transistor are made to occur.

Also, regarding metal silicide, metal layers may easily remain in a stringer-like manner at the edge of the base semiconductor layer 112 of the above bipolar transistor, and this metal exfoliates in the production process or the like of the semiconductor device, thereby causing a short circuit between elements or wirings, for example.

This means that, in the case of the conventional structure shown in FIG. 16, since the metal layer is directly deposited on the end surface of the emitter semiconductor layer 114, the metal silicide layer 116 is formed across the entire surface; however, regarding the base semiconductor layer 112, the sidewall $113_{s2}$ made by the insulating layer 113 exists at the end surface thereof and unevenness is created, so that the metal layer tends to remain in a stringer-like manner from the shoulder portion at the edge to the uneven part of the base semiconductor layer 112, and this becomes a reason for a short circuit by exfoliation as mentioned above, causing deterioration in the yield rate, reliability and the like.

SUMMARY OF THE INVENTION

The present invention provides a semiconductor device including a bipolar transistor, and a method for manufacturing thereof, in which the above-described inconveniences are prevented.

A semiconductor device according to the present invention is the semiconductor device in which a bipolar transistor is formed on a semiconductor substrate, including: a collector region on the semiconductor substrate; a first insulating layer having a first opening in the collector region, which is formed on the surface of the semiconductor substrate; and a base semiconductor layer formed in contact with the collector region through the first opening, with the edge thereof being formed across the first insulating layer to extend onto the first insulating layer.

Further, an emitter semiconductor layer is formed in a limited region, namely, in a predetermined region on the base semiconductor layer; a second insulating layer is formed on the first insulating layer covering the edge of the base semiconductor layer; and a second opening which opens the contact portion of the emitter semiconductor layer to the base semiconductor layer and a third opening which opens a base electrode take-out portion of the base semiconductor layer are formed.

Then, a metal silicide layer is formed on the contact portion of the emitter semiconductor layer and on the surface of the base semiconductor layer opened by the third opening.

Furthermore, a method for manufacturing the semiconductor device according to the present invention is the method for manufacturing the semiconductor device in which a bipolar transistor is formed on a semiconductor substrate, including the processes of: forming a collector region on the semiconductor substrate; forming a first insulating layer on the surface of the semiconductor substrate; forming a first opening in the collector region of the first insulating layer; forming a base semiconductor layer in contact with the collector region through the first opening extending onto the first insulating layer; forming a second insulating layer on the first insulating layer and on the base semiconductor layer; forming in the second insulating layer a second opening in the portion where an emitter region is formed on the base semiconductor layer; forming an emitter semiconductor layer in contact with the base semiconductor layer through the second opening, which extends onto the second insulating layer; forming a third opening in a base take-out region other than the part covering the edge of the base semiconductor layer of the second insulating layer; and forming a metal silicide layer on the surface of the emitter region and on the surface of the base semiconductor layer exposed through the third opening; as a result, the intended semiconductor device is manufactured.

BRIEF DESCRIPTION OF DRAWINGS

FIGS. 2A and 2B are schematic cross sectional views each showing a production process of an example of a method for manufacturing a semiconductor device according to the present invention;

FIGS. 4A and 4B are schematic cross sectional views each showing a production process of an example of a method for manufacturing a semiconductor device according to the present invention;

FIGS. 7A and 7B are schematic cross sectional views each showing a production process of another example of a method for manufacturing a semiconductor device according to the present invention;

FIGS. 8A and 8B are schematic cross sectional views each showing a production process of another example of a method for manufacturing a semiconductor device of the present invention;

DETAILED DESCRIPTION OF THE PRESENTLY PREFERRED EMBODIMENTS

Figure 1:
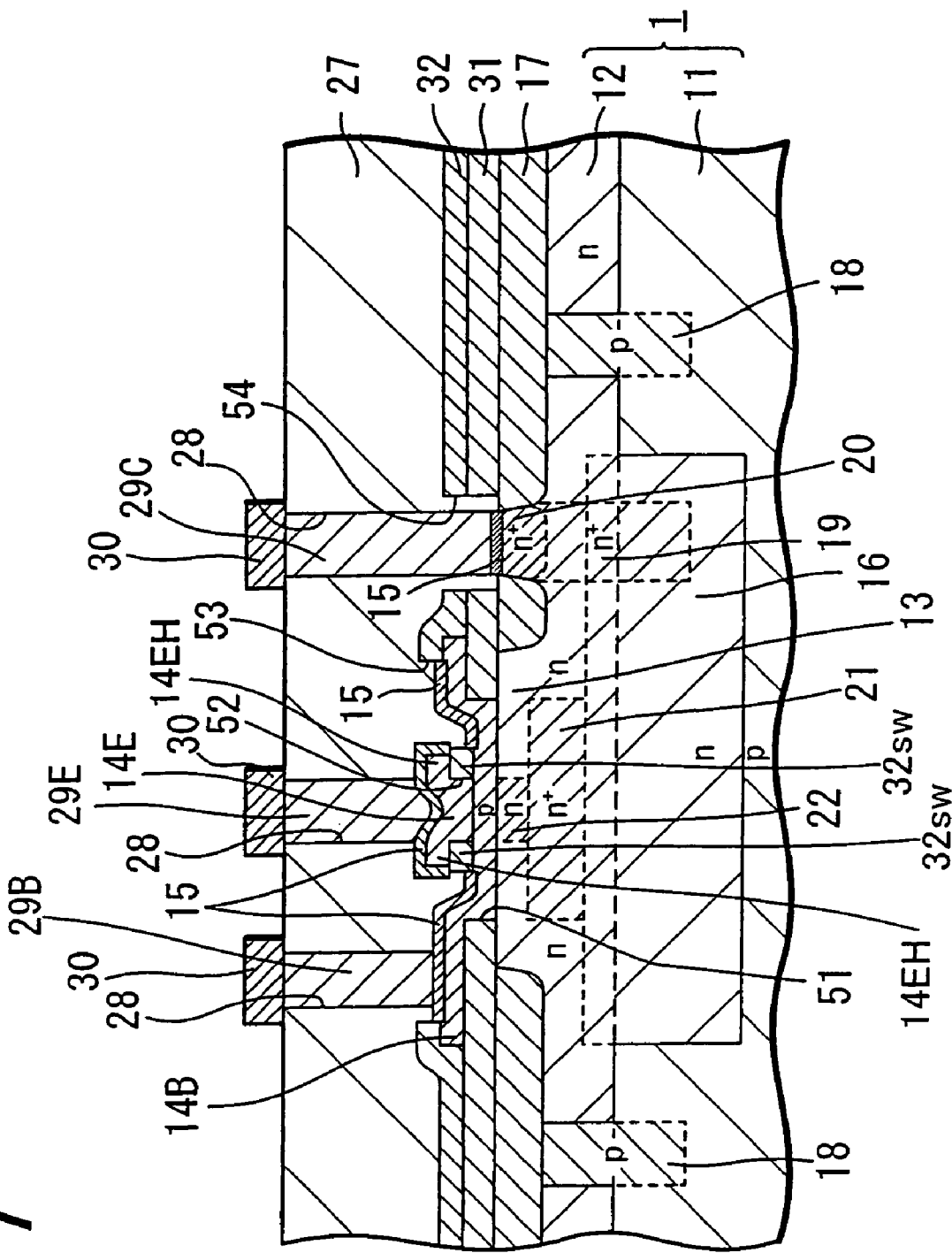
FIG. 1 is a schematic cross sectional view showing relevant parts of an example of a semiconductor device according to the present invention.

In FIG. 1, a schematic cross sectional view showing relevant parts of an embodiment of a semiconductor integrated circuit device including a bipolar transistor according to the present invention is shown.

FIG. 1 shows an example of a silicon semiconductor integrated circuit in which an npn-type vertical bipolar transistor is formed on a semiconductor substrate 1.

In this semiconductor device, the semiconductor substrate 1 is made in such a manner that an n-type Si semiconductor layer 12 is epitaxially grown on a p-type Si semiconductor substrate 11.

A collector region 13 is formed on the semiconductor substrate 1, and a first insulating layer 31 made of for example $SiO_2$, in which a first opening 51 is formed, is formed on the collector region 13 on the surface of the semiconductor substrate 1, namely, on the surface of the semiconductor layer 12 in this case.

A base semiconductor layer 14B made of an Si-containing semiconductor, for example, containing Si or SiGe and constituting an intrinsic base region and a base electrode take-out portion is formed.

The base semiconductor layer 14B is formed over the first insulating layer 31 so that the edge thereof extends onto the first insulating layer 31.

Also, an emitter semiconductor layer 14E constituting an Si or Si-containing emitter region is selectively formed on the base semiconductor layer 14B.

A second insulating layer 32 is formed on the first insulating layer 31, covering the edge of the base semiconductor layer 14B on the first insulating layer 31, and also on this second insulating layer 32, second and third openings 52 and 53 which open a base electrode take-out portion on the base semiconductor layer 14B and a contact portion between the emitter semiconductor layer 14E and the base semiconductor layer 14B are formed.

A metal silicide layer 15 is formed on the surface of the emitter semiconductor layer 14E and on the surface of the base semiconductor layer 14B inside the third opening 53.

Referring to FIGS. 2 to 5, this semiconductor device according to the present invention is explained in detail together with an example of a method for manufacturing the semiconductor device according to the present invention.

In this example, as shown in FIG. 2A, the p-type single-crystal Si semiconductor substrate 11 is prepared and on a main surface of which, the n-type Si semiconductor layer 12 is epitaxially grown to constitute the Si semiconductor substrate 1.

An n-type collector buried region 16 is formed in the substrate 11 by implanting highly concentrated n-type impurities under the portion where the collector region is formed.

A separating and insulating layer 17 which separates the portion where the bipolar transistor is formed from the other portion is formed on the surface of the semiconductor substrate 1, namely, on the semiconductor layer 12. The separating and insulating layer 17 can be formed by forming, for example, at first a concave portion in the portion, and then performing local thermal oxidation so-called LOCOS (Local Oxidation of Silicon) on the semiconductor layer 12 inside the concave portion.

Also, under that, an element separation region 18 surrounding the portion where the bipolar transistor is formed and performing element separation by p-n junction is formed by ion implantation.

Further, when this separating and insulating layer 17 is formed, an n-type plug-in region 19 positioned on the collector buried region 16 and having the depth reaching the collector buried region 16 into which highly concentrated n-type impurities have been ion-implanted is formed in the separating and insulating layer 17. Additionally, an n-type highly concentrated impurities collector electrode take-out region 20 is formed on the surface of this plug-in region 19 by ion implantation, for example.

As shown in FIG. 2B, the first insulating layer 31 in which the first opening 51 is formed is formed on the surface of the semiconductor substrate 1 where the separating and insulating layer 17 and the like have been formed in this manner.

With respect to the first insulating layer 31, $SiO_2$ for example is entirely deposited by CVD (Chemical Vapor Deposition) method or the like, and by coating the layer with a photoresist layer 23, and executing pattern exposure and development, an opening 23W is formed in the portion where the first opening 51 is to be formed; and the first insulating layer 31 is etched through this opening 23W to obtain the first opening 51.

Then, a collector highly concentrated region 21 is formed by ion-implanting n-type impurities through the opening 23W of the photoresist layer 23 and the first opening 51.

Figure 3A:
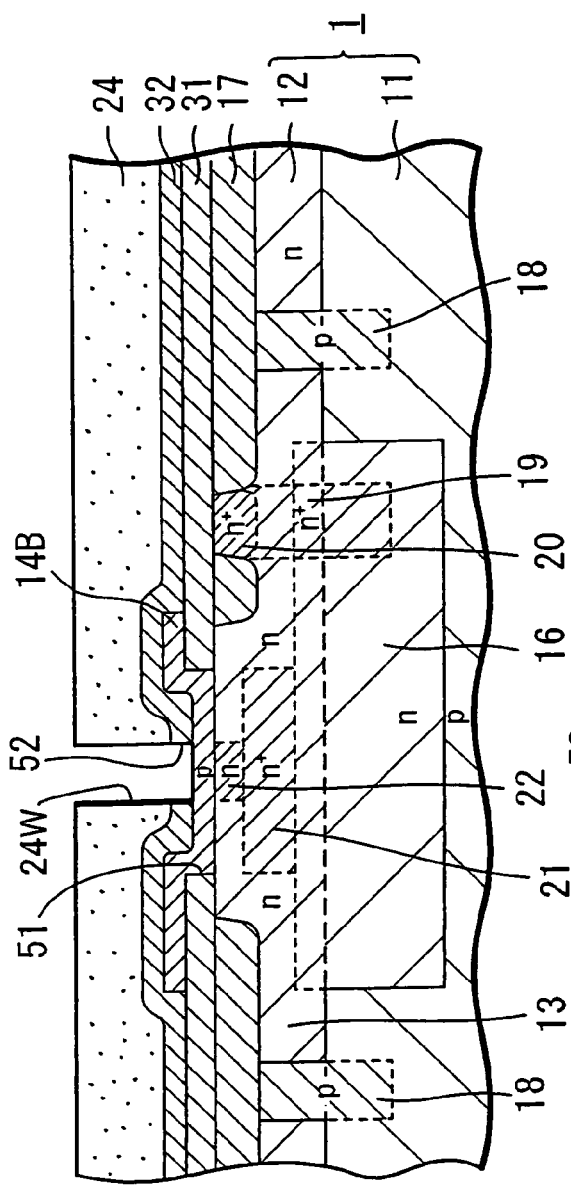
FIGS. 3A and 3B are schematic cross sectional views each showing a production process of an example of a method for manufacturing a semiconductor device according to the present invention.

As shown in FIG. 3A, the base semiconductor layer 14B is formed.

Although not shown in the figure, at first the base semiconductor layer 14B is epitaxially grown on the entire surface of first insulating layer 31. Then, the portion deposited on the single-crystal Si semiconductor layer 12 by epitaxial growth through the opening 51 is formed as a single-crystal layer, and the part deposited on the insulating layer 31 is formed as a polycrystalline layer.

Further, the base semiconductor layer 14B formed on the entire surface is patterned by means of photolithography to constitute an intrinsic base and a base electrode take-out portion are formed, and at least to extend from inside the first opening 51 and onto the insulating layer 31 outside the opening 51.

After that, although not shown in the figure, at first the second insulating layer 32 made of $SiO_2$ is entirely formed by CVD or the like covering the base semiconductor layer 14B, and then the second opening 52 is formed by pattern etching by means of photolithography to be positioned on the first opening 51 and opposite to the collector highly concentrated region 21. Specifically, a photoresist layer 24 is formed, an opening 24W is formed on the portion where the second opening 52 is formed, and the second opening 52 is formed through this opening 24W.

The area and the position of this second opening 52 correspond to the emitter junction of a bipolar transistor ultimately formed.

Further, through the opening 24W and the second opening 52, n-type impurities are implanted across the base semiconductor layer 14B with the required energy to form a collector operation region 22 on the collector highly concentrated region 21 of the collector region 13.

Figure 3B:
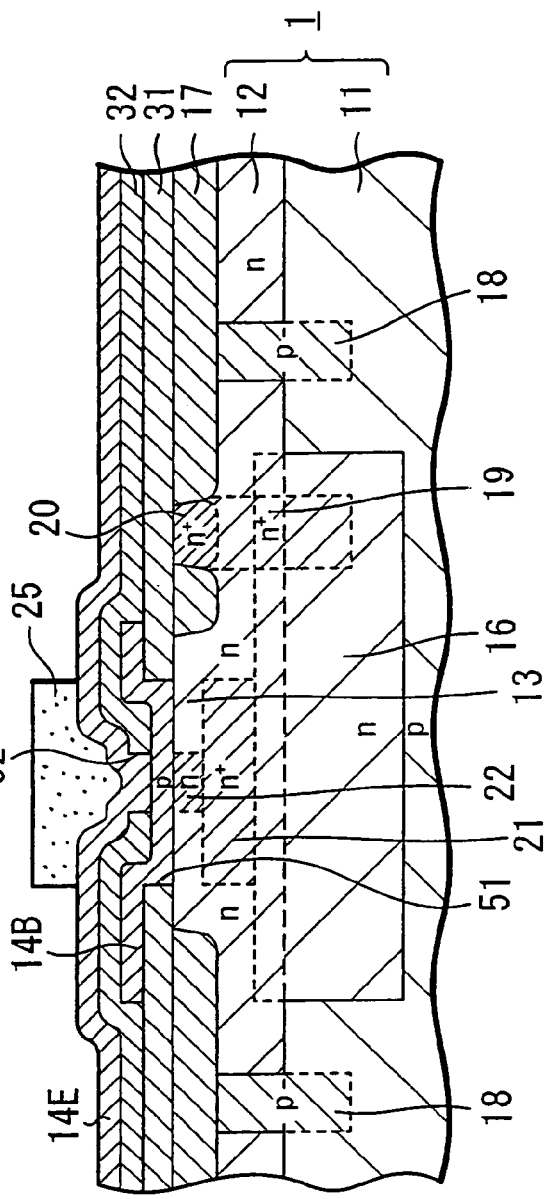

Next, as shown in FIG. 3B, the photoresist layer 24 shown in FIG. 3A is removed, and at first the emitter semiconductor layer 14E made of polycrystalline Si is entirely deposited in contact with the base semiconductor layer 14B through the second opening 52.

Subsequently, a photoresist layer 25 is formed on the emitter semiconductor layer 14E. This photoresist layer 25 is patterned to include the area and the position corresponding to the emitter junction of the bipolar transistor ultimately formed, namely, to include the area of the emitter semiconductor layer ultimately formed and to have a greater area than the ultimately formed layer; and also the photoresist layer 25 is patterned to be removed from the edge of the base semiconductor layer 14B extending to the outside thereof.

As shown in FIG. 4A, pattern etching is performed onto the emitter semiconductor layer 14E with the photoresist layer 25 shown in FIG. 3B serving as a mask, and the photoresist layer 25 is removed.

Further, as shown in FIG. 4B, a photoresist layer 26 having a requiring pattern is formed.

The photoresist layer 26 is formed on the second opening 52 and on the peripheral part of the opening 52 on the emitter semiconductor layer 14E, a ring-like opening $26W_1$ is provided around periphery thereof, for example, and further, an opening $26W_2$ is formed on the collector electrode take-out region 20. The size and the position of the ring-like opening $26W_1$ are selected such that the edge of the base semiconductor layer 14B is covered with the photoresist layer 26.

The emitter semiconductor layer 14E is etched with this photoresist layer 26 serving as a mask.

Figure 5A:
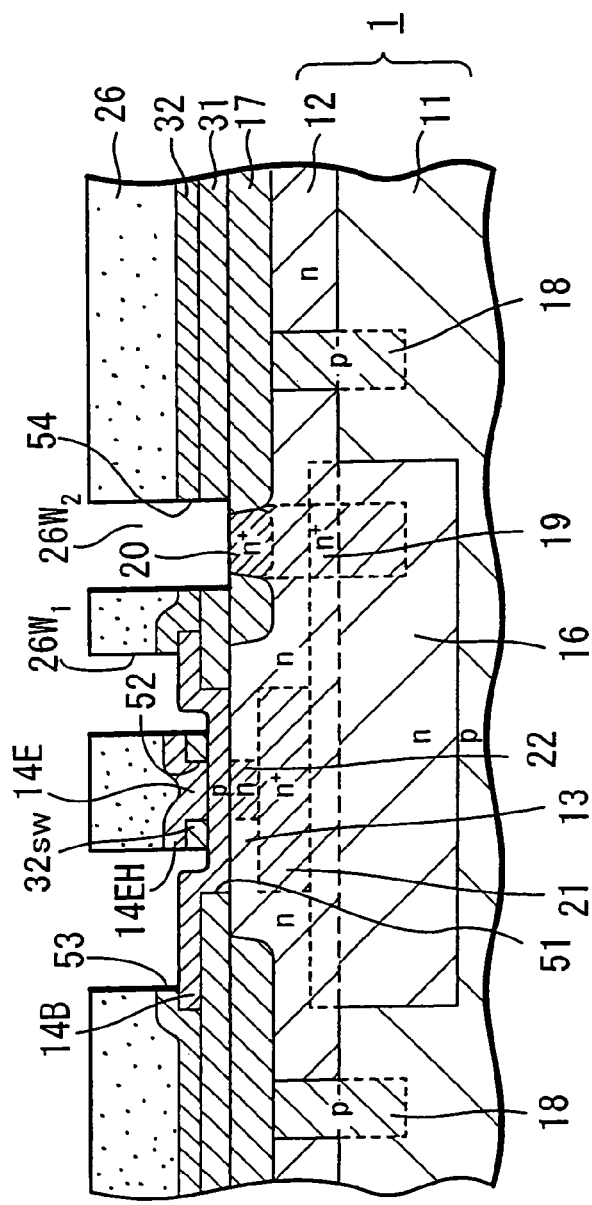
FIGS. 5A and 5B are schematic cross sectional views each showing a production process of an example of a method for manufacturing a semiconductor device according to the present invention.
Figure 5B:
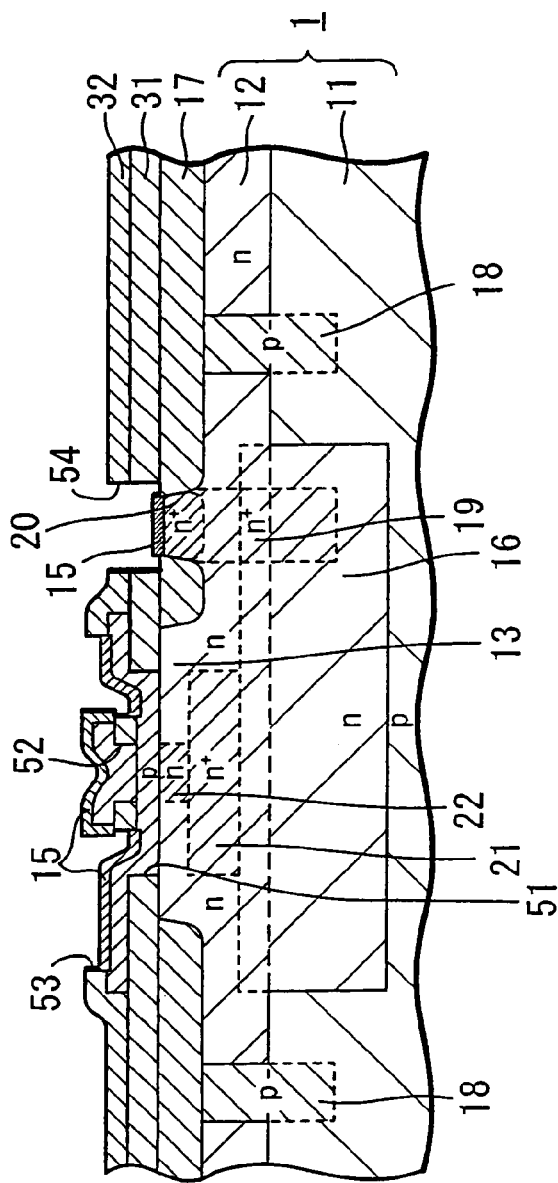

Then, as shown in FIG. 5A, the second insulating layer 32 exposed to the outside through the opening $26W_1$ is etched and removed with the photoresist layer 26 serving as a mask, the third opening 53 which exposes the base electrode take-out portion of the base semiconductor layer 14B to the outside is formed as shown in FIG. 5B, and the second insulating layer 32 exposed to the outside through the opening $26W_2$ and the first insulating layer 31 formed underneath are etched, so that a fourth opening 54 which exposes the collector electrode take-out portion to the outside is formed.

As regards the emitter semiconductor layer 14E formed in this manner, an extending portion 14EH having a requiring width which protrudes from the inside of the second opening 52 to the outside thereof is formed, and an intercalated insulating layer 32SW made of the second insulating layer 32 which is between the first opening 52 and the third opening 53 is formed under the extending portion 14EH.

As shown in FIG. 5B, the photoresist layer 26 is removed, and Ti, Co, or the like capable of forming a metal silicide layer by combining with a Si semiconductor is entirely deposited and heat treatment is performed. Accordingly, reaction is caused between Si and metal only on the emitter semiconductor layer 14E directly exposed to the outside, on the base electrode take-out portion of the base semiconductor layer 14B exposed to the outside through the openings 53 and 54, and in the collector electrode take-out region 20, so that the metal silicide layer 15 is formed selectively.

After that, the metal which has not been silicidated is etched and removed.

In this case, since the edge of the base semiconductor layer 14B is covered with the second insulating layer 32, metal stringers mentioned above can be prevented from generating.

After that, as shown in FIG. 1, a planarizing and insulating layer 27 made of, for example, BPSG (Boron Phosphorus Silicate Glass) is formed on the entire surface.

In the planarizing and insulating layer 27, through-holes 28 are each provided on the metal silicide layer 15 on the base electrode take-out portion of the base semiconductor layer 14B, on the emitter semiconductor layer 14E, and on the collector electrode take-out region 20; and a base electrode 29B, an emitter electrode 29E, and a collector electrode 29C of conductive plugs conventionally formed by filling, for example, tungsten (W) are contacted in the through-holes 28. Further, a conductive layer 30 constituting wiring or electrodes formed on the planarizing and insulating layer 27 is electrically contacted to the base electrode 29B, the emitter electrode 29E, and the collector electrode 29C.

As described above, a semiconductor integrated circuit device in which a vertical bipolar transistor is formed as a circuit element is constructed.

It should be noted that each of the aforementioned base semiconductor layer 14B and emitter semiconductor layer 14E can be formed as semiconductor layers doped with p-type and n-type impurities, respectively, when they are deposited, and also n-type and p-type impurities can be doped by ion-implantation to form semiconductor layers of each type after the layers have been deposited.

In the aforementioned example, the metal silicide layer 15 is formed on the entire surface of the emitter semiconductor layer 14E; however, when this metal silicide layer 15 is formed, in case there is a possibility that spikes penetrating the emitter-base junction are generated and the junction is destructed or leak occurs, such a manner can be taken that a film that prevents metal from being silicidated may be formed on the surface of the emitter semiconductor layer 14E.

Figure 6:
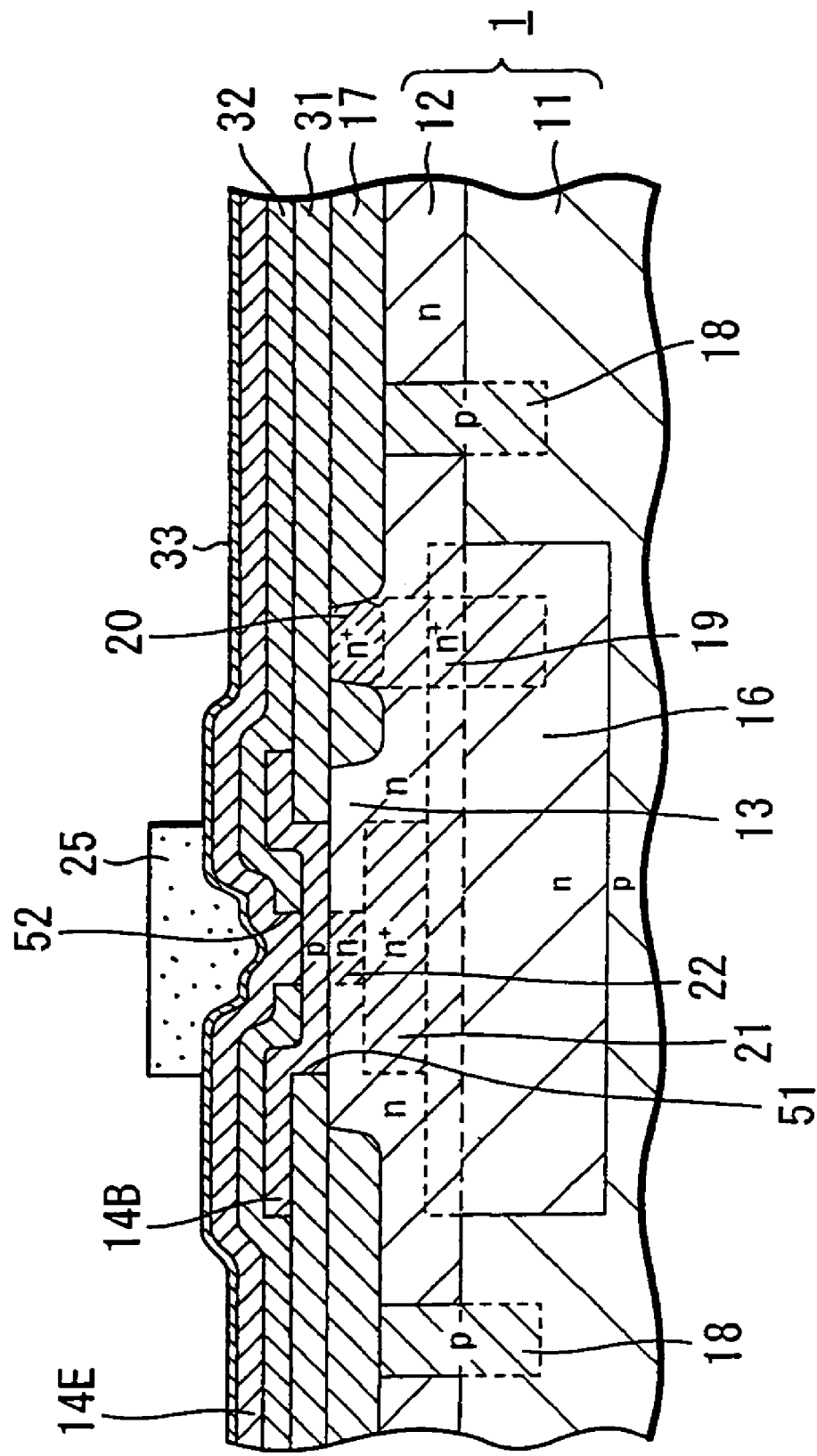
FIG. 6 is a schematic cross sectional view showing a production process of another example of a method for manufacturing a semiconductor device according to the present invention.

Referring to FIGS. 6 to 8, an example of the manufacturing method of this case is explained.

In this case, the same processes as those in FIGS. 2A and 2B, and FIG. 3A can be adopted. Then, as shown in FIG. 6, after the emitter semiconductor layer 14E is entirely formed in the same manner as explained in FIG. 3B, a silicidation preventing film 33 made of, for example, an SiO$_2$ insulating layer or the like is formed on the entire surface of the layer 14E.

A similar photoresist layer 25 to that explained in FIG. 3B is formed on the silicidation preventing film 33.

As shown in FIG. 7A, the silicidation preventing film 33 and the emitter semiconductor layer 14E are etched, with this photoresist layer 25 serving as an etching mask.

Next, in the same manner as explained in FIG. 4B, the photoresist layer 26 is formed and etched as shown in FIG. 7B.

As shown in FIGS. 8A and 8B, etching is executed with the photoresist layer 26 serving as a mask, the photoresist layer 26 is removed, and the metal silicide layer 15 is formed, in the same manner as in FIGS. 5A and 5B.

Figure 9:
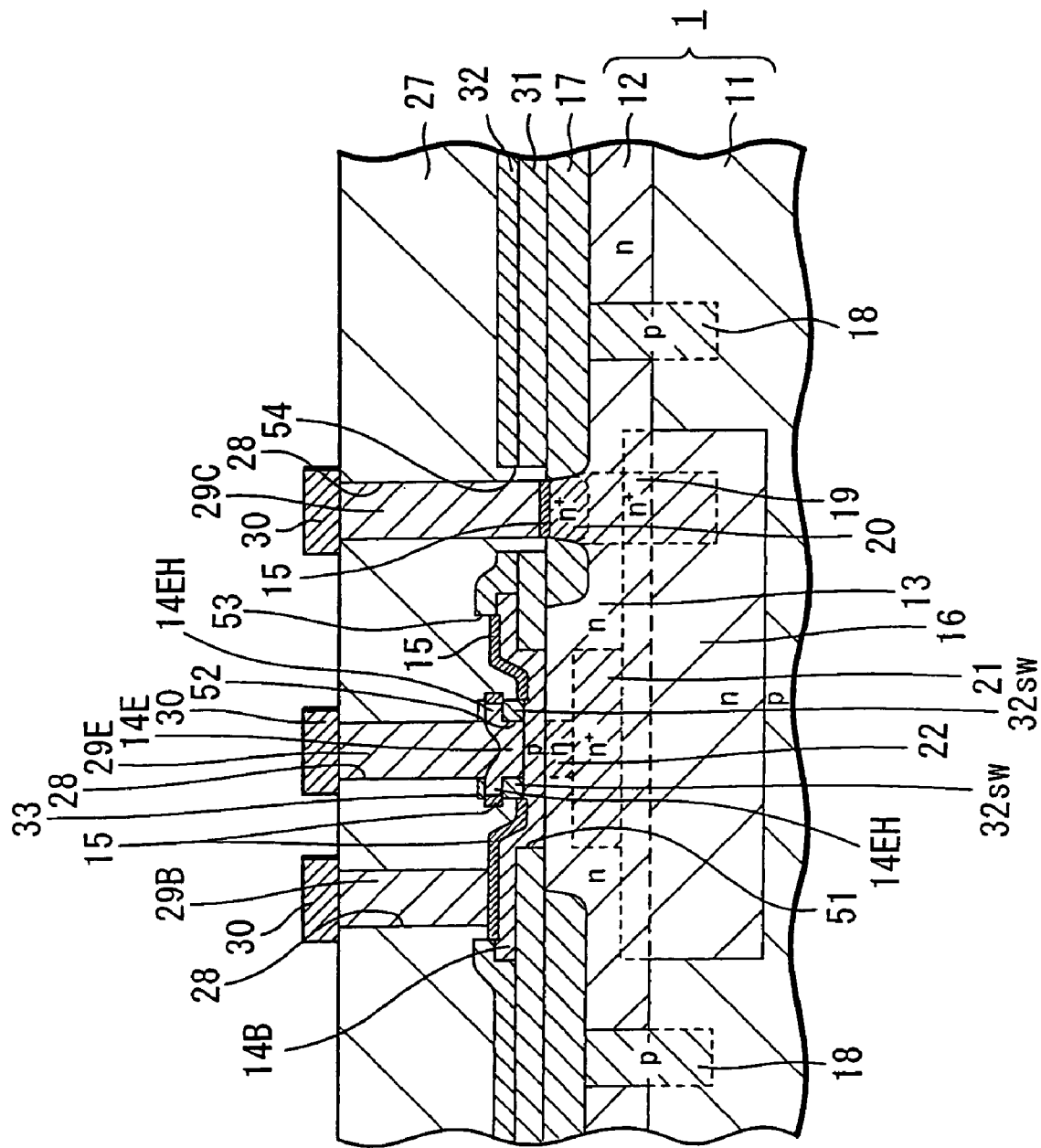
FIG. 9 is a schematic cross sectional view showing another example of a semiconductor device according to the present invention.

Then, as shown in FIG. 9, when the contact through-hole 28 is provided on the emitter semiconductor layer 14E, the emitter electrode 29E is in contact with the emitter semiconductor layer 14E, with the silicidation preventing film 33 also being removed.

According to this manufacturing method, regarding the formation of the metal silicide 15, the silicidation preventing film 33 is formed on the surface of the emitter semiconductor layer 14E, so that the metal silicide layer 15 is not formed at least on the portion where the emitter-base junction is formed, thereby preventing spikes from being generated.

It should be noted that in FIGS. 6 to 9 the same reference numerals are given to parts which correspond to those in FIGS. 1 to 5, and redundant explanations thereof will be omitted.

According to the aforementioned manufacturing method, since the metal silicide layer 15 formed on the outside base region including the base electrode take-out region outside the region, where the emitter semiconductor layer 14E of the base semiconductor layer 14B is contacted, to form the emitter contact region (namely the intrinsic base region) is defined and formed in a manner by the emitter semiconductor layer 14E, the metal silicide layer on this base semiconductor layer is formed in a self-aligned manner with being very close to the intrinsic base region. According to the above, base resistance is reduced, noise characteristics are improved, and the maximum operation frequency $f_{max}$ can be increased.

According to the aforementioned bipolar transistor of the present invention, since the end of the base semiconductor layer 14B is covered with the second insulating layer 32, generation of metal stringers which may cause accidents relating to short circuit can be prevented efficiently, so that the yield rate and reliability can be improved.

Further, according to the aforementioned manufacturing method of the present invention, it is also possible to form metal silicide on the collector electrode take-out region without requiring a particular production process, concurrently with the formation of the metal silicide layer for the emitter and the base, and contact resistance to the collector can be sufficiently reduced due to the fact that a metal silicide layer for this collector has been formed. Accordingly, it is possible to improve the saturation voltage $V_{CE(sat)}$ between the collector and emitter, the current capacity with which the current gain $h_{FE}$ begins to decrease, the maximum cutoff frequency $f_{Tmax}$ and the maximum vibration frequency $f_{max}$, and low-voltage operation and high driving capability, as was mentioned above.

Also, since the cross-sectional area of the collector electrode can be diminished because of the decrease in contact resistance to the collector, the degree of integration can be improved, cost can be prevented from rising, and deterioration of high-frequency characteristics owing to the increase in the parasitic capacitance of the transistor can be avoided.

High-frequency characteristics can be further improved by constructing the base semiconductor layer 14B of SiGe, as mentioned above.

FIG. 1 and FIGS. 2 to 5 only show the portion of the semiconductor substrate 1, in which the bipolar transistor is formed; however, in a practical semiconductor integrated circuit, various circuit elements can be formed parallel on the same substrate 1, with at least a part of structure being formed concurrently in production processes common to each other, other than the aforementioned bipolar transistor having the base and the emitter by epitaxial growth.

Figure 10:
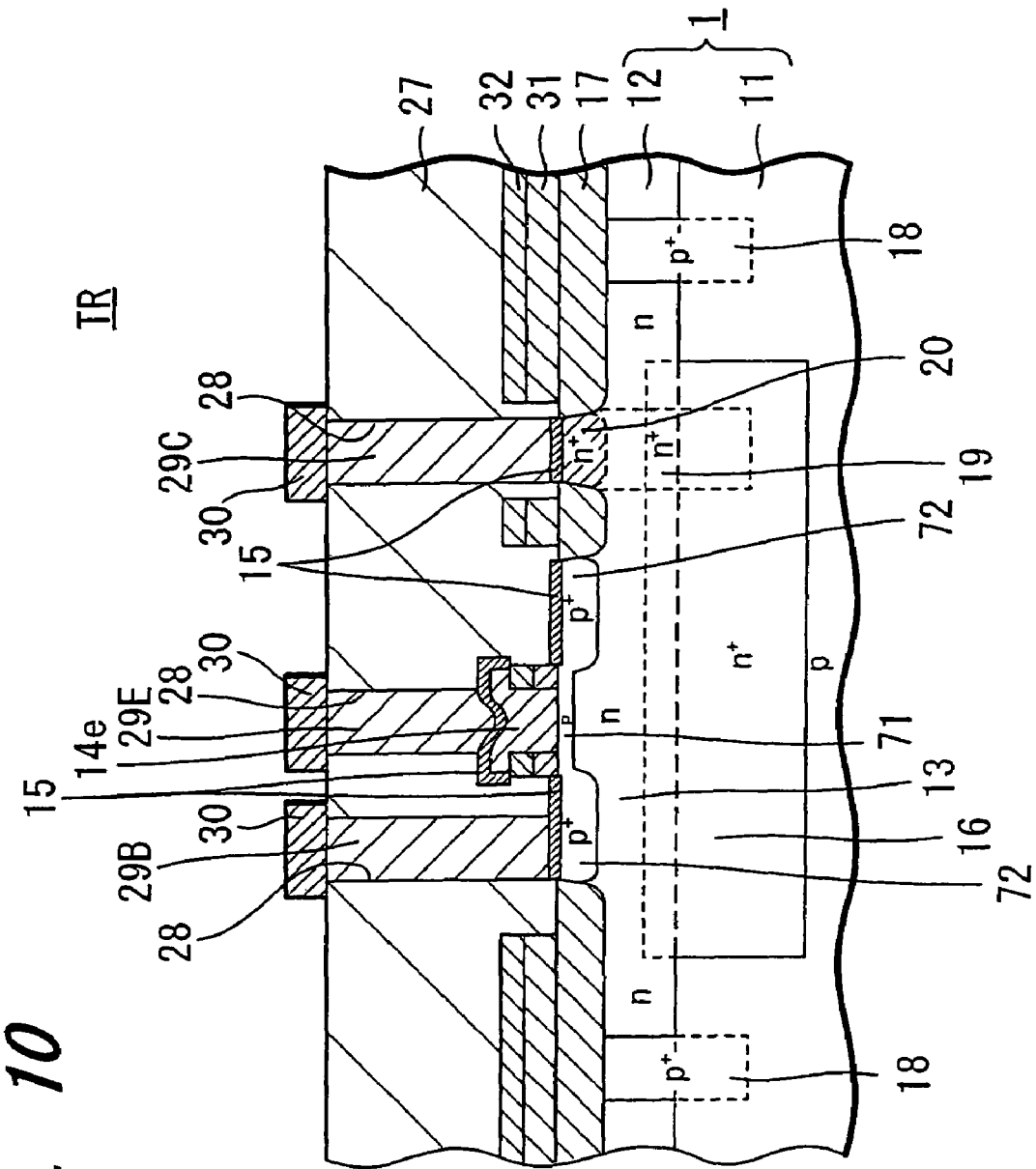
FIG. 10 is a schematic cross sectional view showing another circuit element in an example of a semiconductor device according to the present invention.

As shown in the schematic cross sectional view of FIG. 10, a base diffusion type bipolar transistor TR can be constructed. In FIG. 10, the same reference numerals are given to parts which correspond to those in FIG. 1, and redundant explanations thereof will be omitted, because those corresponding portions can be formed concurrently with the parts explained in FIGS. 1 to 5.

In this case, on the semiconductor layer 12 of the semiconductor substrate 1, an intrinsic base region 71 is formed by selective ion implantation and diffusion, and a base electrode take-out region 72 positioned outside thereof is formed by, for example, the diffusion of p-type impurities.

A similar metal silicide layer 15 is formed on an emitter semiconductor layer 14e, the base electrode take-out region 72, and the collector electrode take-out region 20, in the process of forming the metal silicide layer 15 shown in FIG. 1.

The contact through-holes 28 are each provided in the planarizing and insulating layer 27 on the emitter semiconductor layer 14e, on the base electrode take-out region 72, and on the collector electrode take-out region 20, where the metal silicide layer 15 is formed, and each of the electrodes 29E, 29B and 29C are contacted in the same manner as shown in FIG. 1.

Figure 11:
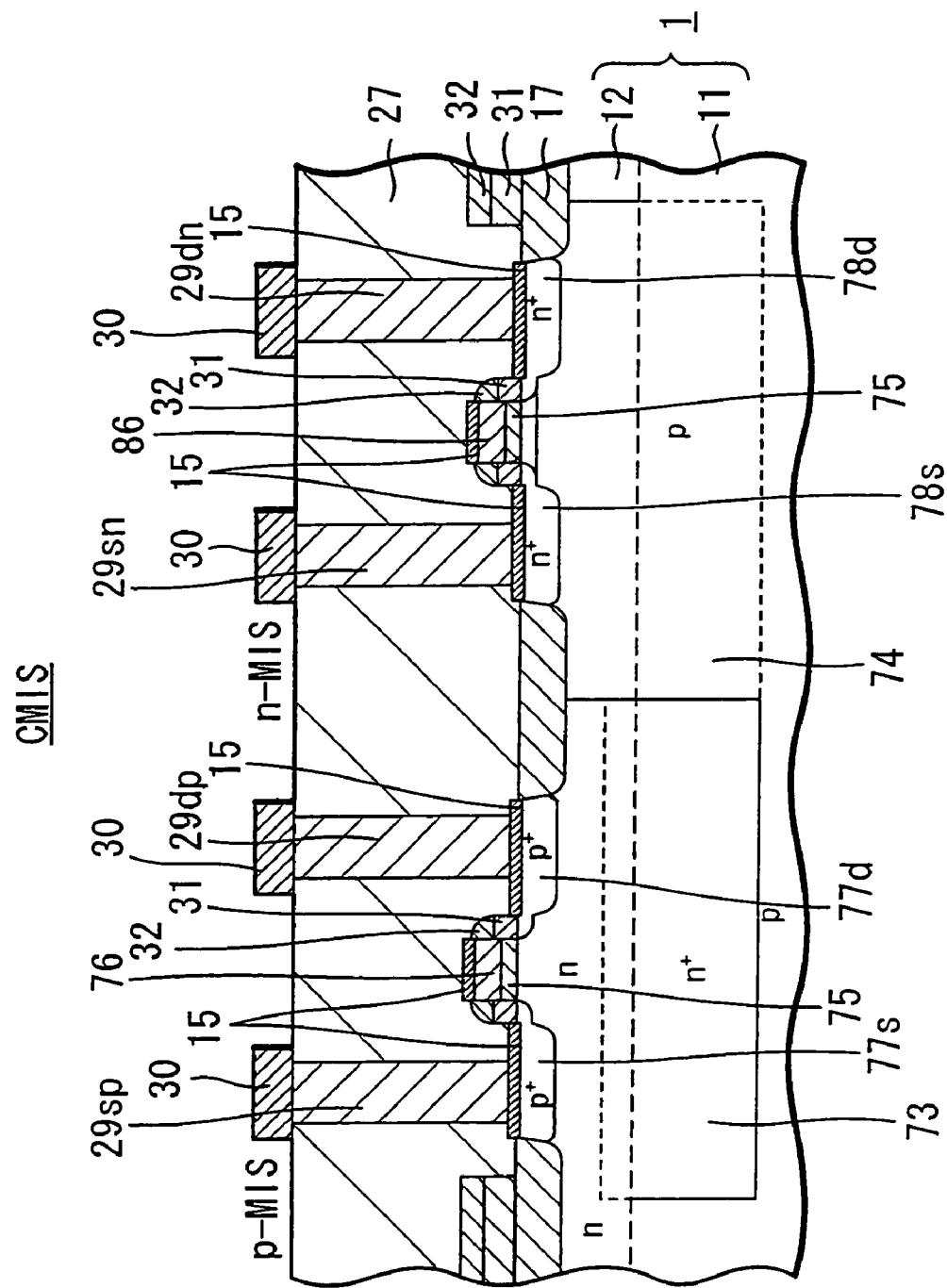
FIG. 11 is a schematic cross sectional view showing another circuit element in an example of a semiconductor device according to the present invention.

Also, as shown in FIG. 11, as another circuit element, a complementary field-effect transistor (so-called CMOS) CMIS can be constructed on the same semiconductor substrate 1. In this example, lightly concentrated drain regions of a p-channel field-effect transistor pMIS and an n-channel field-effect transistor nMIS, constituting this complementary field-effect transistor, are formed on the gate portion side, which is called a LDD (Lightly Doped Drain) construction in other words.

In this case also, the same reference numerals are given to parts in FIG. 11 which correspond to those in FIG. 1. There is no mention of how these parts are formed, on the grounds that they can be formed concurrently with the corresponding parts explained in FIGS. 1 to 5.

Basically, the pMIS and nMIS can be formed by a conventional formation method; a part of that can be formed concurrently and in common with the operation processes explained in FIGS. 1 to 5 and in the process explained in FIG. 6.

In this example, an n-well region 73 and a p-well region 74 are formed in the portions where the pMIS and nMIS are formed, respectively.

Each of the gate portions of the pMIS and nMIS is composed of a gate insulating layer 75 made of, for example, SiO2, SiN, or the like and a gate electrode 76 made of polycrystalline Si formed thereon. With these gate portions serving as masks, lightly concentrated source and drain regions can be formed by lightly doping p-type and n-type impurities, respectively.

Also, source and drain regions 77s and 77d of the pMIS can be formed in the same process of forming the base electrode take-out region 72 shown in FIG. 10, for example.

In this case also, a metal silicide layer 15 is formed in each of the source and drain regions concurrently with formation of the metal silicide layer 15 shown in FIG. 1, and each of the source and drain electrodes 29sp and 29dp, 29sn and 29dn, is contacted to the layer through each contact through-hole 28 provided in the planarizing and insulating layer 27.

Figure 12:
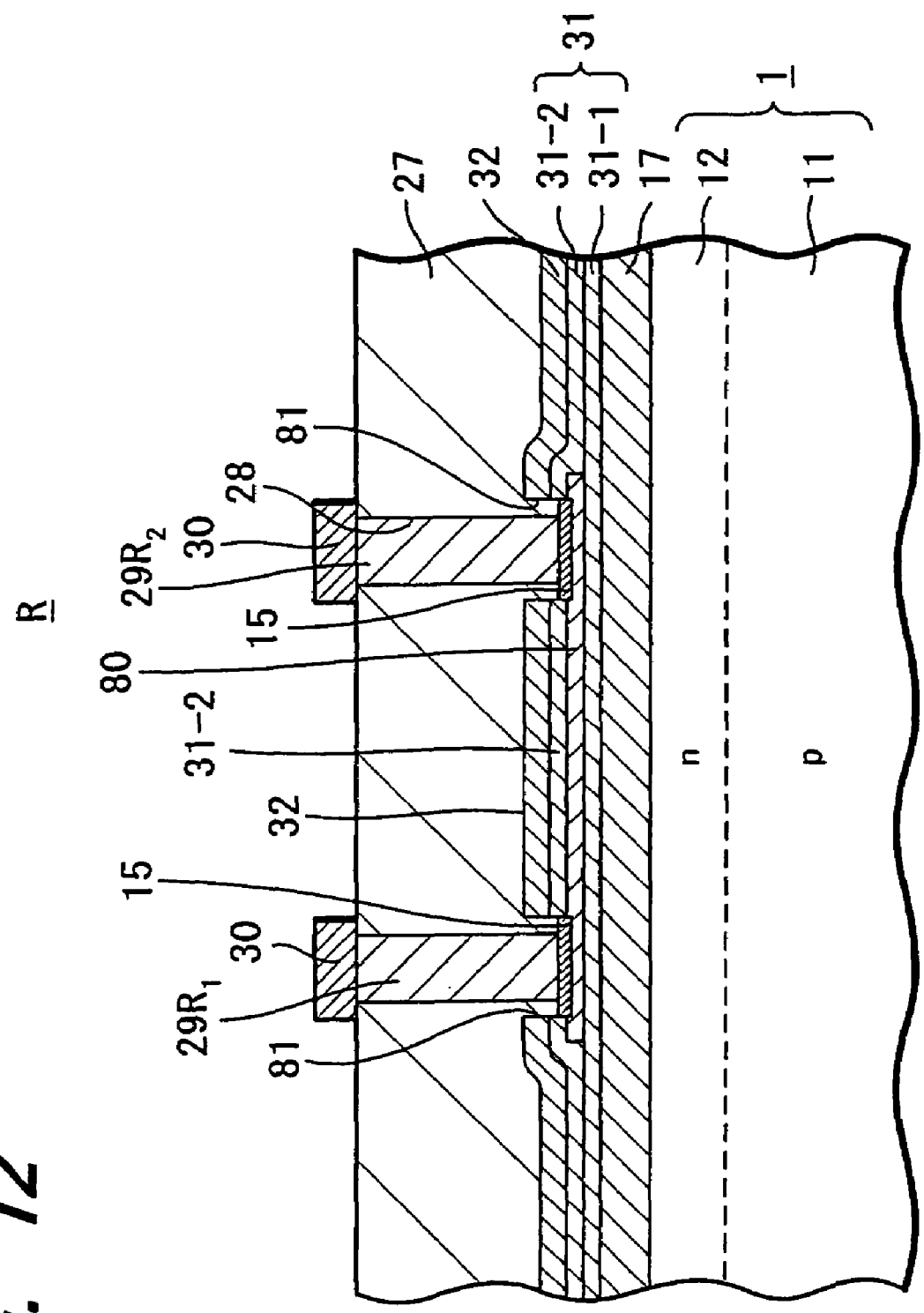
FIG. 12 is a schematic cross sectional view showing another circuit element in an example of a semiconductor device according to the present invention.

Also, FIG. 12 is a case in which a semiconductor resistance element R made of a semiconductor resistance layer 80 is constructed as another circuit element, and in this FIG. 12 also, the same reference numerals are given to parts which correspond to those in FIGS. 1 to 5 and redundant explanations thereof will be omitted.

In this case, however, the first insulating layer 31 is formed such that the layer is divided into two layers of a lower insulating layer 31-1 and an upper insulating layer 31-2; in this case, also in the structure shown in FIG. 1, the first insulating layer 31 is composed of a two-layer structure consisting of the lower and upper layers.

Then, in this case, the lower insulating layer 31-1 made of SiO$_2$ or the like is formed on the separating and insulating layer 17, an Si polycrystalline semiconductor layer is formed thereon by the CVD method or the like to have a predetermined resistance by ion implantation or the like, and the semiconductor resistance layer 80 is formed with a requiring pattern by means of photolithography.

After that, the aforementioned second insulating layer 32 is formed, and contact openings 81 are formed on the first and second insulating layers 31 and 32, for example, on both ends of the semiconductor resistance layer 80, concurrently with the formation of the fourth opening 54 in FIG. 1. The aforementioned metal silicide layer 15 is formed by reaction between the semiconductor resistance layer 80 which has been exposed through these openings 81 and Si.

Then, the contact through-hole 28 is formed on each of the openings 81 concurrently with the formation of the semiconductor resistance layer 80 in FIG. 12, and electrodes 29R1 and 29R2 are each formed in the same process as that of forming each electrode 29E and the like in FIG. 1. Accordingly, the intended semiconductor resistance element R is formed.

Figure 13:
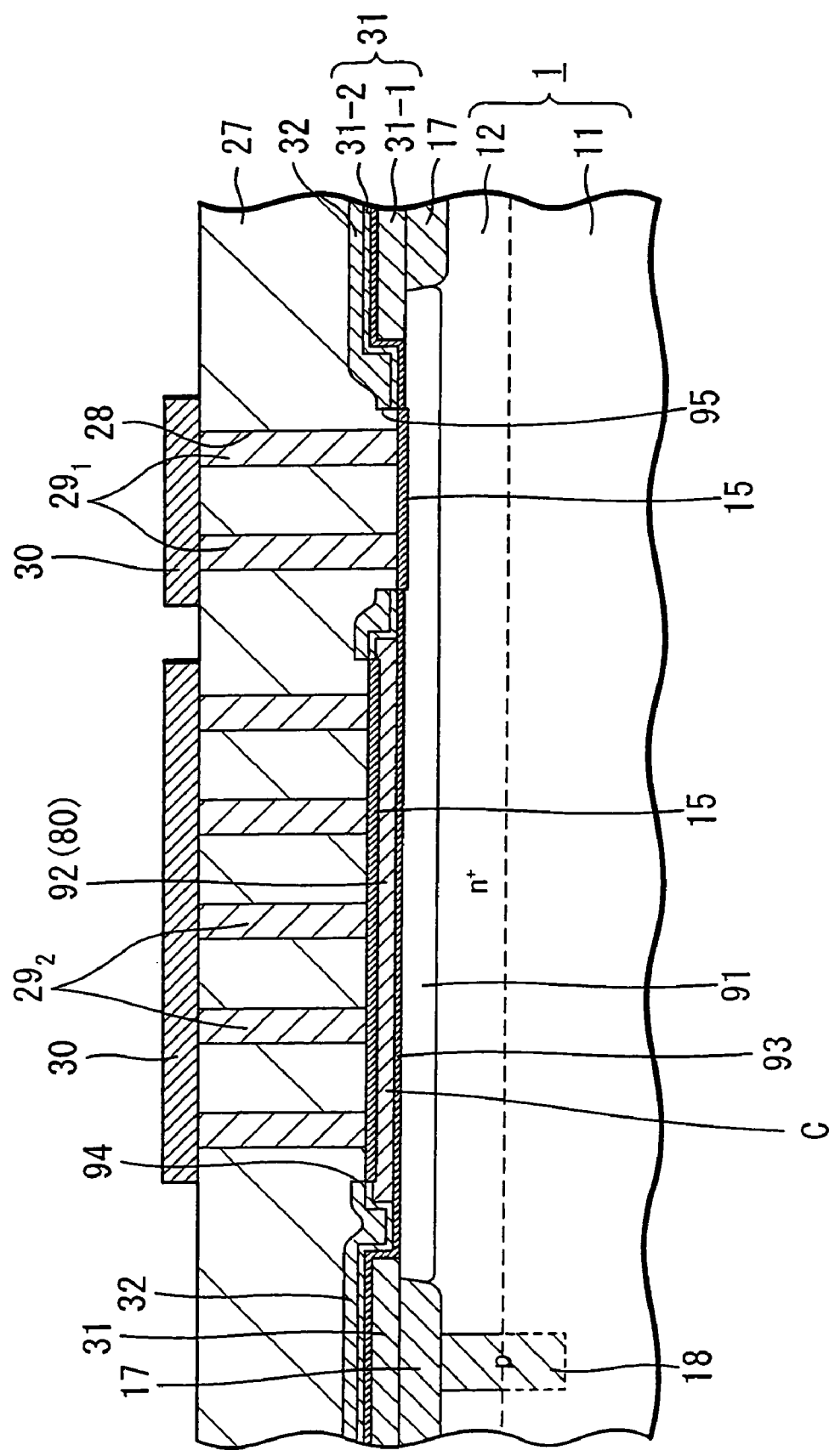
FIG. 13 is a schematic cross sectional view showing another circuit element in an example of a semiconductor device according to the present invention.
Figure 14:
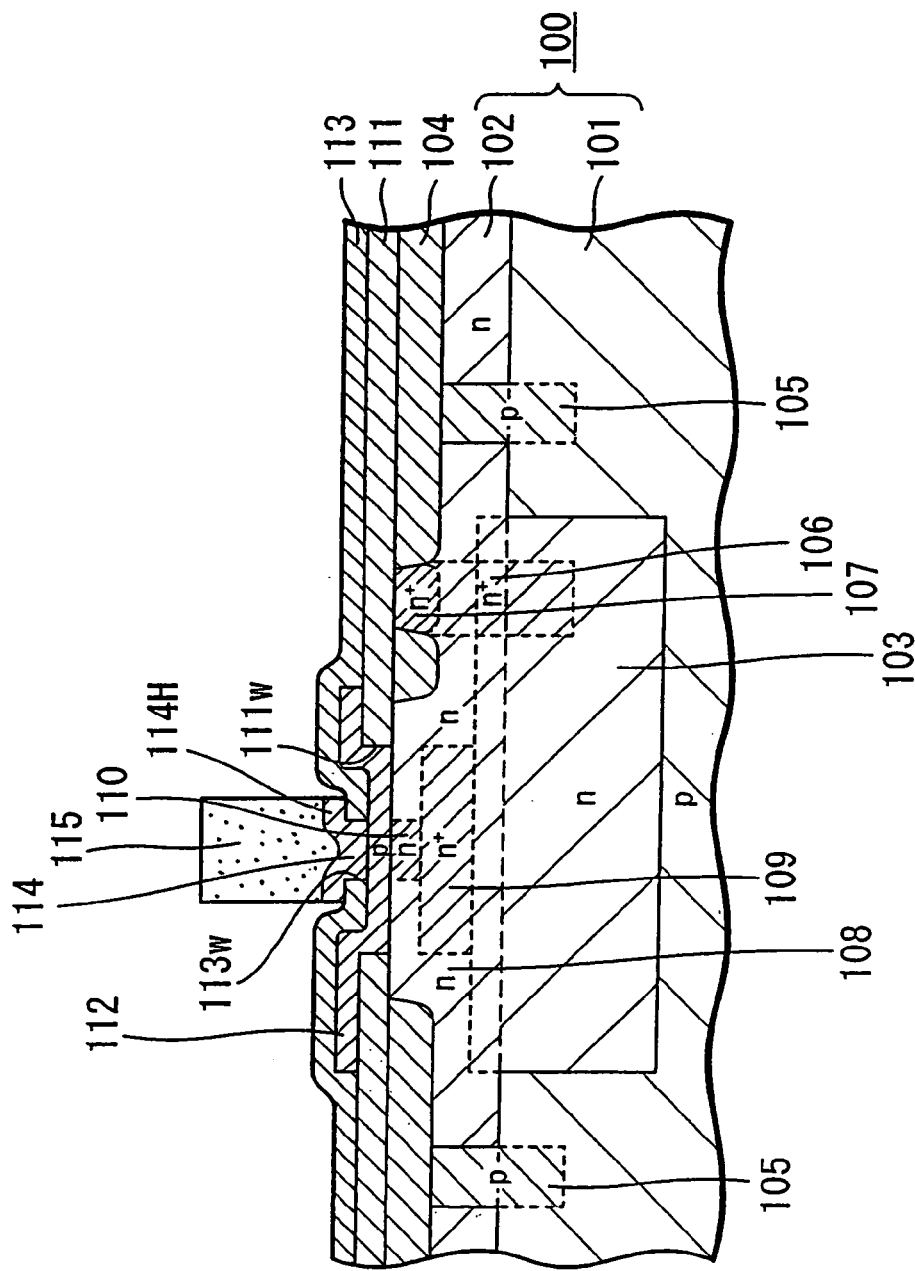
FIG. 14 is a schematic cross sectional view showing a production process of a semiconductor device including a conventional bipolar transistor.
Figure 15:
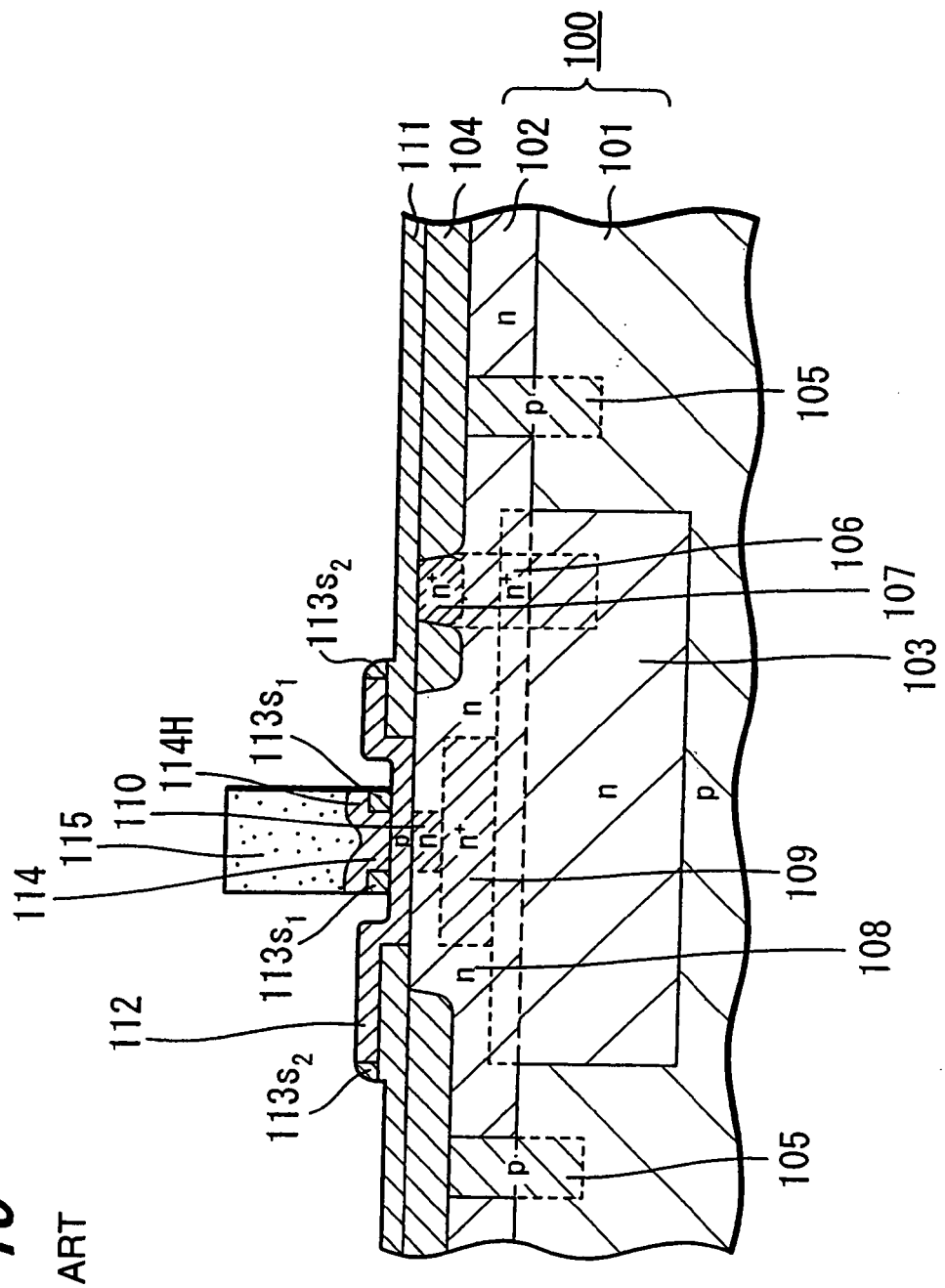
FIG. 15 is a schematic cross sectional view showing a production process of a semiconductor device including a conventional bipolar transistor.
Figure 16:
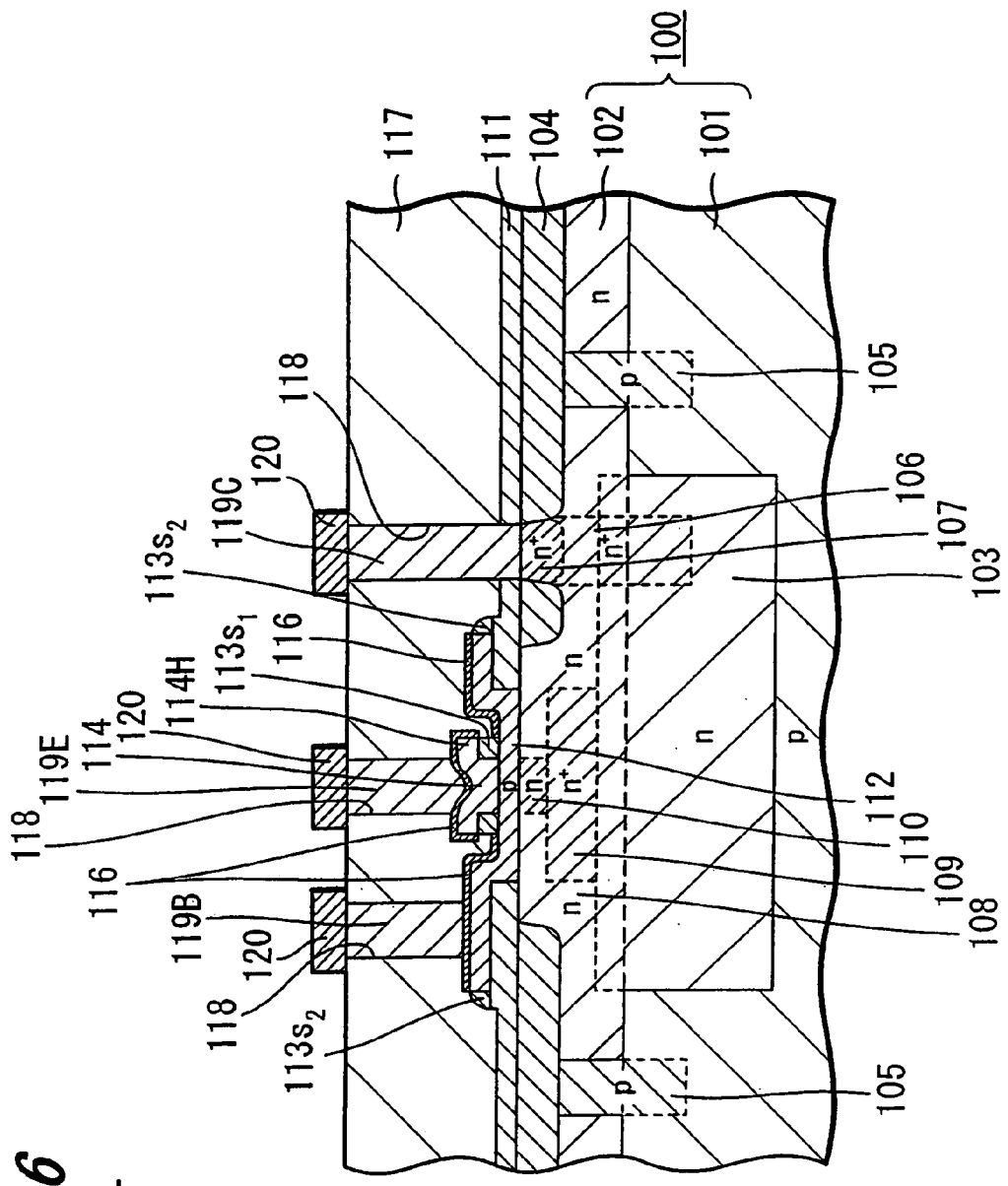
FIG. 16 is a schematic cross sectional view showing a semiconductor device including a conventional bipolar transistor.

Further, FIG. 13 is a case in which a semiconductor capacitance element C is constructed as another circuit element; and in this case also, the same reference numerals are given to parts in FIG. 13 which correspond to those in FIGS. 1 to 5 and redundant explanations thereof will be omitted.

In this case, on the semiconductor layer 12 of the semiconductor substrate 1, a first semiconductor electrode region 91 constituting one electrode is, for example, formed concurrently with the formation of the collector electrode take-out region 20 in FIG. 1, a dielectric layer 93 made of, for example, Si$_3$N$_4$ is formed thereon, and an electrode semiconductor layer 92 made of, for example, the aforementioned semiconductor layer 80 constituting an opposing electrode is formed thereon.

In the second insulating layer 32, an opening 94 and, for example, a plurality of openings 95 are respectively provided on the electrode semiconductor layer 92 and the electrode semiconductor region 91, concurrently with the formation of the third and fourth openings 54 in FIG. 1, for example.

Then, the metal silicide layer 15 is formed concurrently with the formation of the metal silicide layer 15 in FIG. 1 through these through-holes 94 and 95.

Further, on the planarizing and insulating layer 27 formed on the entire surface of the substrate 1, the contact through-holes 28 which link to the openings 95, and a plurality of contact through-holes 28 which link to the opening 94 are formed concurrently with the formation of the contact through-holes 28 in FIG. 1, and the first electrode 291 and the second electrode 292 are contacted through these through-holes 28 concurrently with the electrode 29E or the like in FIG. 1 being contacted.

By means of the conductive layer 30, the plurality of electrodes 291 are electrically linked between themselves, and the plurality of electrodes 292 are electrically linked between themselves, so that capacitance is formed among the electrodes 291 and among the electrodes 292.

According to the device and the manufacturing method of the present invention, the metal silicide layer 15 is reliably formed on each portion where an electrode is taken out.

It should be noted that the semiconductor device and the manufacturing method according to the present invention are not limited to the aforementioned aspects and embodiments; and for example a construction in which each n-conductive type is made to a p-conductive type or vice versa is acceptable, and various transformations and modification can be made in accordance with the construction of the present invention, depending on the intended construction of the semiconductor integrated circuit.

According to the present invention mentioned above, the intended metal silicide layer is accurately and appropriately formed in the position where it is intended, so that a reliable semiconductor device can be obtained.

Further, according to the bipolar transistor of the present invention, since the edge of the base semiconductor layer 14B is covered with the second insulating layer 32, occurrence of metal stringers which may cause accidents relating short circuit is efficiently prevented, so that the yield rate and reliability can be improved.

Also, according to the present invention, it is possible to form metal silicide on the collector electrode take-out region without adding a particular production process, concurrently with the formation of the metal silicide layer for the emitter and the base, and due to the fact that a metal silicide layer has been formed on this collector, contact resistance to the collector can sufficiently be reduced. Accordingly, it is possible to improve the saturation voltage $V_{CE(sat)}$ between the collector and emitter, the current capacity with which the current gain $h_{FE}$ begins to decrease, the cutoff frequency $f_{Tmax}$ and the maximum vibration frequency $f_{max}$, and low-voltage operation and high driving capability, as was mentioned above.

Further, since the cross-sectional area of the collector electrode can be smaller because of the decrease in contact resistance to the collector, the degree of integration can be improved, cost can be prevented from rising, and the deterioration of high-frequency characteristics due to the increase in the parasitic capacitance of the transistor can be avoided.

Furthermore, according to the aforementioned manufacturing method, since the formation of the metal silicide layer on the base semiconductor layer is defined by the emitter semiconductor layer as mentioned above, the metal silicide layer can be formed on this base semiconductor layer in a self-aligned manner extremely close to the intrinsic base region, base resistance can be reduced, noise characteristics can be improved, and the maximum vibration frequency $f_{max}$ can be improved.

Also, according to the present invention, in order to prevent the inconveniences mentioned above that are caused by overetching, the insulating layer interposed under the extended portion of the emitter semiconductor layer is prevented from being thin, so that increase in the parasitic capacitance and decrease in speed caused thereby, and the like can be prevented and great effectiveness can be obtained according to the construction and the manufacturing method of the present invention.

What is claimed is:

1. A semiconductor device including a bipolar transistor formed on a semiconductor substrate, wherein
    a collector region is formed on said semiconductor substrate;
    on the surface of said semiconductor substrate a first insulating layer which has a first opening in said collector region is formed;
    a base semiconductor layer is formed in contact with said collector region through said first opening;
    said base semiconductor layer is formed over said first insulating layer with the edge thereof extending onto said first insulating layer;
    an emitter semiconductor layer is formed in a predetermined region on said base semiconductor layer;
    on said first insulating layer, a second insulating layer is formed covering the edge of said base semiconductor layer, and a second opening which opens a contact portion of said emitter semiconductor layer to said base semiconductor layer and a third opening which opens a base electrode take-out portion of said base semiconductor layer are formed; and
    a metal silicide layer is formed on the surface of said base semiconductor layer inside said third opening.

2. A semiconductor device according to claim 1, wherein a metal silicide layer is formed on the surface of said emitter semiconductor layer.

3. A semiconductor device according to claim 1, wherein a collector take-out region is formed on said semiconductor substrate, a fourth opening is formed in said first and second insulating layers on said collector take-out region, and a metal silicide layer is formed on the surface of said collector take-out region opened to the inside of said fourth opening.

4. A semiconductor device according to claim 1, wherein said base semiconductor layer is made of an SiGe layer.

5. A semiconductor device according to claim 1, wherein on said semiconductor substrate said bipolar transistor and other semiconductor circuit elements are formed, and said metal silicide layer is formed on electrode take-out portions of said other semiconductor circuit elements.

6. A semiconductor device according to claim 5, wherein said other semiconductor circuit elements comprise at least one of a capacitance element, a resistance element, a complementary field-effect transistor, and a transistor having a base by means of selective diffusion.

* * * * *

UNITED STATES PATENT AND TRADEMARK OFFICE
CERTIFICATE OF CORRECTION

PATENT NO.        : 7,064,417 B2                                       Page 1 of 1
APPLICATION NO.   : 10/487622
DATED             : June 20, 2006
INVENTOR(S)       : Chihiro Arai It is certified that error appears in the above-identified patent and that said Letters Patent is hereby corrected as shown below:

ON THE TITLE PAGE

Add item:

--(30) Foreign Application Priority Data

Aug. 28 2001  (JP)     2001-258015--

(22) PCT Filed

"May 15, 2002" should be --Aug. 15, 2002--

Signed and Sealed this

Thirty-first Day of March, 2009

JOHN DOLL
*Acting Director of the United States Patent and Trademark Office*